United States Patent
Shiozaki

[11] Patent Number: 6,132,569
[45] Date of Patent: Oct. 17, 2000

[54] METHOD FOR PRODUCING PHOTOVOLTAIC ELEMENT

[75] Inventor: Atsushi Shiozaki, Kyoto, Japan

[73] Assignee: Canon Kabushiki Kaisha, Tokyo, Japan

[21] Appl. No.: 08/986,634

[22] Filed: Dec. 8, 1997

[30] Foreign Application Priority Data

Dec. 18, 1996 [JP] Japan ................................. 8-337935

[51] Int. Cl.[7] ........................ H01L 31/052; H01L 31/18; H01L 31/20; C23C 14/34

[52] U.S. Cl. ................ 204/192.27; 136/246; 136/252; 136/259; 136/256; 136/261; 438/72; 204/298.07; 204/298.24; 257/436; 257/432

[58] Field of Search ................... 136/246, 252, 136/259, 256, 261; 438/72; 204/192.27, 298.07, 298.24; 257/436, 432

[56] References Cited

U.S. PATENT DOCUMENTS

| | | | |
|---|---|---|---|
| 4,419,533 | 12/1983 | Czubatyj | 136/259 |
| 4,532,372 | 7/1985 | Nath | 136/256 |

FOREIGN PATENT DOCUMENTS

| | | |
|---|---|---|
| 0 698 929 A2 | 2/1996 | European Pat. Off. . |
| 698929 | 2/1996 | European Pat. Off. . |
| 62-211377 | 9/1987 | Japan . |
| 2-185963 | 7/1990 | Japan . |
| 2-297737 | 12/1990 | Japan . |
| 7-150346 | 6/1995 | Japan . |
| 7-224379 | 8/1995 | Japan . |

OTHER PUBLICATIONS

Patent Abstracts of Japan, vol. 015, No. 083 (P–1171), Feb. 26, 1991 (JP 02–297737).
Patent Abstracts of Japan, vol. 012, No. 075 (C–480), Mar. 9, 1988 (JP 62–211377).
Patent Abstracts of Japan, vol. 010, No. 345 (C–386), Nov. 20, 1986 (JP 61–147870).

*Primary Examiner*—Alan Diamond
*Attorney, Agent, or Firm*—Fitzpatrick, Cella, Harper & Scinto

[57] ABSTRACT

The present invention is to provide a method for producing a photovoltaic element having a reflective layer with high reflectivity and with high reliability and thus showing high photoelectric conversion efficiency, and especially to provide a production method causing no change in the reflection characteristics of a deposited film, even in continuous production on a long substrate for a long period. The production method of a photovoltaic element of the present invention is a method for producing a photovoltaic element having a reflective layer and a semiconductor layer on a long substrate, comprising the steps of supplying an inert gas, hydrogen atoms, and oxygen atoms into a vacuum vessel housing the substrate and effecting sputtering by use of a target comprising aluminum, thereby forming the reflective layer on the substrate.

6 Claims, 2 Drawing Sheets

METHOD FOR PRODUCING PHOTOVOLTAIC ELEMENT

BACKGROUND OF THE INVENTION

1. Field of the Invention

The present invention relates to a method for producing a photovoltaic element with high conversion efficiency of energy from light to electricity, based on effective utilization of incident light.

2. Related Background Art

In search of a semiconductor layer for a photovoltaic element, research and development has extensively been carried out on materials including so-called thin film semiconductors using crystal-based semiconductors of monocrystalline or polycrystalline silicon with high conversion efficiency, amorphous silicon (hereinafter referred to as a-Si) available at low prices, and compound semiconductors such as $CdS \cdot CuInSe_2$. In any photovoltaic element, the technology leading to the more effective utilization of incident light is one of the most important technologies for removing more electric energy from a limited area.

This technology for effectively utilizing incident light involves techniques related to a transparent electrode for allowing more light to reach the semiconductor layer by preventing reflection on an incident surface of light, a light scattering layer for scattering the incident light to increase optical path lengths in the semiconductor layer, a reflective layer for reflecting light not absorbed by the semiconductor layer, again into the semiconductor layer to utilize the reflected light, and so on.

For example, U.S. Pat. Nos. 4,419,533 and 4,532,372 disclose technology for effectively utilizing the incident light by providing the surface of a reflective layer with a textured structure and scattering the light thereby. They also disclose the technology for forming a transparent, conductive layer on the reflective layer to prevent a short circuit due to defects of the semiconductor layer. The above-mentioned prior art discloses that aluminum, gold, silver, and copper can be used for the reflective layer. However, gold and silver are expensive and silver and copper are electrically ionized in the presence of even a little water, thereby increasing the likelihood of short circuit through the semiconductor layer.

As methods for forming a film of aluminum which is most suitable for the reflective layer among these metals, the following proposals were presented from a viewpoint of enhancing reliability by mainly controlling grain size.

Specifically, Japanese Patent Application Laid-Open No. 62-211377 discloses a method for forming the aluminum film by carrying out sputtering while supplying oxygen gas and controlling the flow rate of the oxygen gas while monitoring the amount thereof by a quadrupole mass spectrometer and describes that the grain size of aluminum can be controlled by the method.

Japanese Patent Application Laid-Open No. 2-297737 discloses a method for forming an aluminum film by sputtering wherein the sputter gas is kept under a pressure of not less than 10 mTorr, thereby preventing corrosion or a deformation defect thereof.

Japanese Patent Application Laid-Open No. 5-171434 discloses a method for forming an aluminum film having no projections in such a way that sputtering is carried out with residual air remaining in a vacuum vessel.

Japanese Patent Application Laid-Open No. 6-116723 discloses a method for obtaining a smooth aluminum film by repetitively carrying out a step of forming an aluminum film by sputtering and a step of exposing this aluminum film to a mixed gas of nitrogen and oxygen.

Japanese Patent Application Laid-Open No. 7-224379 discloses a method of forming an aluminum film by sputtering while introducing oxygen, hydrogen, or water, in addition to an inert gas.

The above-mentioned prior art disclosing the methods for forming an aluminum film discloses nothing about reflectivity of light, particularly, when used for the reflective layer of a photovoltaic element. The art also discloses nothing about the effect on an aluminum film when a transparent, conductive layer of zinc oxide or the like, and a semiconductor layer are stacked on the aluminum film. Further, the above-mentioned prior art describes nothing about change in quality of a formed aluminum film during a continuous film forming method for a long period of time.

The conversion efficiency of photovoltaic elements is expected to increase remarkably by the combination of a transparent electrode, a light scattering layer, and a reflective layer, whereby reduction of price of obtained electric energy is expected. In practice, however, it is often the case that the expected effect is not achieved, and the reduction of electric energy price thus far obtained is not satisfactory. In addition, achievement of long-term reliability throughout 10 to 20 years, as well as high conversion efficiency, is not yet satisfactory. Hence, photovoltaic elements are not yet in widespread system power use.

The aforementioned U.S. Pat. No. 4,419,533 and others disclose that aluminum, gold, silver, and copper can be used for the reflective layer for reflecting the light not absorbed by the semiconductor layer, again into the semiconductor layer to utilize the reflected light. The inventor has found that these metals have good reflectivities, but also have problems in other respects.

First, gold and silver are expensive. Further, when silver or copper is used, there is a problem that short circuit is likely to occur through the semiconductor layer, resulting in failure to extract power. This problem arises, particularly, when only a part of the photovoltaic element is irradiated with light in the presence of moisture for a long period.

After extensive and intensive study, the inventor has found the following facts. When the light irradiates only a part of the photovoltaic element, a potential opposite the polarity of a potential appearing in normal photoelectric conversion is applied to portions of the photovoltaic element which are not irradiated with the light. The action of this opposite potential and water not shut out by protection of an inexpensive resin ionizes the metal element of the reflective layer after long-term use, thus causing short circuit of the semiconductor layer. It has also been found that aluminum and gold are free of this problem.

The inventor has also found that the phenomenon of short circuit of the semiconductor layer can be prevented by sufficiently shutting the water out with provision of a protective film of a vitreous material or the like and that it is difficult to produce an inexpensive, lightweight, and flexible photovoltaic element by this method.

Based on the findings, the inventor has intensively and extensively studied a method for producing a reflective layer by use of aluminum, which is inexpensive and stable and has good reflectivity, or a material mainly containing aluminum, from various aspects.

Methods for producing the aluminum reflective layer on the substrate by sputtering are generally known, as described in U.S. Pat. No. 4,532,372 and others.

Also generally known are methods for stacking the transparent, conductive layer of zinc oxide or the like on the reflective layer or for stacking the semiconductor layer directly on the reflective layer, in order to prevent short circuit between the electrodes due to a pinhole or the like of the semiconductor layer. The inventor has, however, found that stacking of the aluminum layer with the transparent, conductive layer or the semiconductor layer may cause a problematic decrease in reflectivity, as compared with the structure of the single aluminum layer.

The inventor has also found that, especially when a method for continuously producing the photovoltaic element on a long substrate unwound from a substrate roll is employed as an inexpensive production method, there is a problematic decrease in reflectivity with the elapse of time during production for a long period. It has been determined that this is caused by the following: crystallization of the aluminum film proceeds due to energy upon deposition of the transparent, conductive layer or the semiconductor layer above the reflective layer, grain boundaries develop therewith, and the grain boundaries absorb the light to lower the reflectivity, thereby decreasing the quantity of light that can be converted to electricity in the semiconductor layer. The inventor has also determined the cause of the problem wherein reflectivity of the deposited film gradually decreases from start to end of formation in the continuous production method for a long term: a residual gas remaining in the vacuum system and containing water as the main component decreases with the passage of time, grain boundaries develop with increase in speed of crystallization of the aluminum film, and the grain boundaries absorb the light to lower the reflectivity, thereby decreasing the quantity of light that can be converted to electricity in the semiconductor layer.

It has been thus difficult heretofore to obtain a desired reflective layer with a good reflectivity, at a reasonable price, and with high reliability continuously for a long period by simple sputtering of aluminum by the conventionally known methods.

SUMMARY OF THE INVENTION

An object of the present invention is to provide a method for producing a photovoltaic element having a reflective layer with high reflectivity and with high reliability and thereby having high photoelectric conversion efficiency, and especially to provide a production method free of change in the reflection characteristics of the deposited film even in continuous production on a long substrate for a long period.

A method for producing a photovoltaic element according to the present invention is a method for producing a photovoltaic element having a reflective layer and a semiconductor layer on a long substrate, comprising the steps of supplying an inert gas, hydrogen atoms, and oxygen atoms into a vacuum vessel housing the long substrate and effecting sputtering by use of a target comprising aluminum, thereby forming the reflective layer on the long substrate.

DESCRIPTION OF THE PREFERRED EMBODIMENTS

An embodiment of the production method of the present invention will be briefly described with reference to the drawings.

Figure 1:
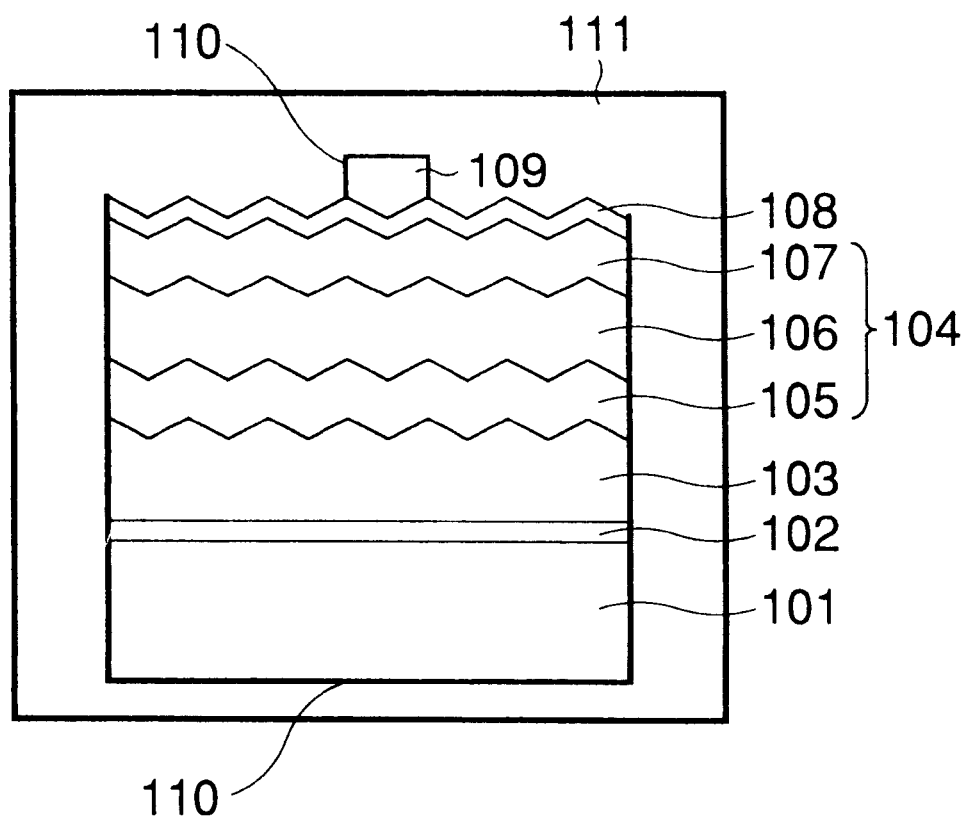
FIG. 1 is a schematic view showing a cross-sectional structure of an example of the photovoltaic element produced by the present invention.

FIG. 1 shows a cross-section of a photovoltaic element produced according to the present invention. In FIG. 1, reference numeral 101 designates a substrate, 102 a reflective layer, 103 a transparent, conductive layer, 104 a semiconductor layer comprised of an n-type Si layer 105, an i-type Si layer 106, and a p-type Si layer 107, 108 a transparent electrode, 109 a collector electrode, 110 output terminals, and 111 a protective resin.

The production method of the present invention will be outlined below.

First, the conductive substrate 101 is set in a vacuum vessel, and the vacuum vessel is evacuated to a pressure of not more than $10^{-4}$ Torr. An inert gas such as argon gas, hydrogen atoms, and oxygen atoms are supplied into the vacuum vessel by use of mass flow controllers. The hydrogen atoms and oxygen atoms are supplied by hydrogen gas and oxygen gas, respectively, or by water vapor.

A plasma is induced while maintaining the pressure inside the vacuum vessel at several mTorr, and a reflective layer 102 consisting of aluminum or mainly containing aluminum is deposited on the substrate. When water vapor is supplied, preferred flow rate ratios of inert gas to water vapor are 100:(2 to 10). Preferred flow rate ratios of inert gas, hydrogen gas, and oxygen gas are 100:(2 to 10):(1 to 5).

In order to continue forming a film on the long substrate over a long period, it is preferred that the amount of water vapor or the amounts of oxygen and hydrogen in the deposition chamber are monitored, and the amounts of introduced gas are controlled so as to keep the amount of water vapor or the amounts of oxygen and hydrogen always constant.

Then the transparent, conductive layer 103 of zinc oxide or the like having a surface with several-hundred-nm unevenness is continuously formed on the reflective layer. Then the semiconductor layer 104 is produced on the conductive layer, using another vacuum system. The reference numeral 105 denotes an n-type Si layer, 106 an i-type Si layer, and 107 a p-type Si layer. When the semiconductor layer 104 is thin, the whole of the semiconductor layer often exhibits the same textured structure as the transparent, conductive layer 103, as shown in FIG. 1.

Numeral 108 represents a reflection preventing layer also serving as a transparent electrode in the surface. A comb-shaped collector electrode 109 is provided on the reflection preventing layer, and the output is led to the outside by output terminals 110. The element may further be sealed with a transparent resin 111.

In the photovoltaic element produced according to the above procedures, development of crystal grains is suppressed in the reflective layer 102 consisting of aluminum or mainly containing aluminum, so that the reflection of light is as good as that with a single layer film; the light is thus effectively absorbed in the semiconductor layer, thus increasing the photoelectric conversion efficiency. Further, even in continuous production for a long period, no change is seen in the characteristics and reliability is also high.

The photovoltaic element thus produced according to the present invention will be described in further detail as to each of the constituent layers.

Substrate

As the substrate 101 of the present invention, there is used a substrate long enough to be applied to the so-called roll-to-roll method or the step feed method. For example, a metal sheet, a resin film on which a conductive layer is formed, or the like may be used. Among others, stainless steel sheet, galvanized sheet iron, aluminum sheet, and so on are suitably applicable because of their relatively low price.

The surface of the substrate may be polished, but, for example, when the substrate has a well-finished surface like a stainless steel sheet processed by bright annealing, it can be used as is, after mere cleaning with water and blow drying.

Reflective Layer

The material for the reflective layer is aluminum or mainly contains aluminum, and the reflective layer is produced by sputtering. The reflective layer 102 also serves as one electrode of the semiconductor layer 104.

An example of the method for forming the reflective layer 102 will be described referring to FIG. 2. The long substrate 207 rolled is set in a feed chamber 203 and is stretched to a winding chamber 204. After the whole apparatus is evacuated to a predetermined vacuum degree by a vacuum pump not illustrated and a predetermined temperature is attained by use of a heater 205, the long substrate 207 is allowed to move at a constant carrying speed with the speed being monitored by an encoder not illustrated.

An aluminum film is formed by sputtering in a deposition chamber 201. Hydrogen atoms and oxygen atoms, together with an inert gas, are supplied through a gas inlet pipe 210. As the inert gas, there may be used argon (Ar), helium (He), neon (Ne) or the like, with argon being preferred. As the supply sources of hydrogen and oxygen atoms, water vapor or a combination of hydrogen gas and oxygen gas may be used. With a target 208 of aluminum, DC or AC power is supplied from a power supply 212 to induce the plasma, thereby forming the aluminum film. After that, a zinc oxide layer can also be deposited in a deposition chamber 202.

A gas gate or a gate valve may be disposed between the deposition chambers 201, 202, the feed chamber 203, and the winding chamber 204 to separate them from each other.

Transparent, Conductive Layer

The transparent, conductive layer 103 having the finely uneven surface can also be formed by a method such as sputtering, electrodeposition, or the like. The conductive layer needs to have a certain resistance for controlling the current flowing through defects of the semiconductor film. A material for the conductive layer is selected, for example, from zinc oxide, titanium oxide, indium oxide, and tin oxide, or substances mainly containing them. Among them, zinc oxide or a substance containing it is suitably applicable.

This transparent, conductive layer 103 may be omitted according to circumstances. It is also possible to produce the conductive layer continuously in the same vacuum unit 201 as the reflective layer 102 was produced, using the apparatus as shown in FIG. 2.

Semiconductor Layer

A CVD apparatus utilizing RF power, VHF power, microwave power or the like can be used for formation of the semiconductor layer 104. With use of $SiH_4$, $SiF_4$, $PH_3$, and $H_2$ as material gases and the power supplied, an n-type a-Si layer 105 can be formed on the transparent, conductive layer 103. Further, with use of $SiH_4$, $SiF_4$, and $H_2$, an i-type a-Si layer 106 can be formed on the n-type a-Si layer 105. Then, with use of $SiH_4$, $BF_3$, and $H_2$, a p-type pc-Si layer 107 can be formed on the i-type a-Si layer 106, thus making the nip semiconductor layer 104.

This semiconductor layer 104 is not limited to only amorphous and microcrystalline semiconductors, but it is generally made of non-monocrystalline semiconductors. The semiconductor layer may be of either the nip structure or the pin structure, and a plurality of semiconductor layers may also be formed.

Transparent Electrode

The transparent electrode 108 also serves as an electrode on the opposite side to the substrate 101 through the semiconductor layer 104 and desirably has a certain degree of low resistance. The raw material for the transparent electrode is selected, for example, from indium oxide, tin oxide, titanium oxide, zinc oxide, and mixtures thereof. The transparent electrode can be made by vacuum vapor deposition by use of resistance heating or electron beam, or sputtering, and the like, using the above-mentioned raw material.

In order to achieve the reflection preventing effect, the thickness of the transparent electrode is desirably approximately equal to one fourth of the wavelength of the light desired to be mainly prevented from being reflected.

Collector Electrode

For effectively collecting the electric current, a collector electrode of a grid pattern may be provided on the transparent electrode 108 in place of the comb-shaped collector electrode 109. Specific examples of the material for the collector electrode 109 include metals such as Ti, Cr, Mo, W, Al, Ag, Ni, Cu, or Sn, or conductive pastes including silver paste. The conductive pastes are normally those in which a fine powder of silver, gold, copper, nickel, or carbon is dispersed in a binder polymer. Examples of the binder polymer include polyester, epoxy, acrylic, alkyd, polyvinyl acetate, rubber, urethane, and phenol resins. The method for forming the collector electrode 109 is selected from sputtering with a mask pattern, resistor heating, CVD method, a method for evaporating a metal film over the entire surface and removing unnecessary portions by etching, a method for directly forming the grid electrode pattern by photo-CVD, a method for forming a mask of a negative pattern to the grid electrode pattern and effecting plating thereon, a method of printing a conductive paste, a method for fixing a metal wire with a conductive paste, and so on.

After this, the output terminals 110 are attached to the substrate 101 and to the collector electrode 109 for extracting the electromotive force. One output terminal is attached to the substrate 101 by a method for bonding a metal body such as copper tab or the like thereto by spot welding or soldering, while the other output terminal is bonded to the collector electrode 109 by a method for electrically connecting a metal body thereto by conductive paste or by soldering.

Protective Resin

The protective resin 111 is made of a resin film for coating the surface and a filler (adhesive) resin. Examples of the resin film are fluororesins, polyethylene terephthalate, nylons, polycarbonate, polyethylene, polypropylene, polyvinyl chloride, acrylic resins, and so on. The filler (adhesive) resin can be selected, for example, from resins such as EVA, EEA, acrylic resins, polyamide resins, polychloroprene rubber, butyl rubber, nitrile rubber, phenol resins, melamine resins, epoxy resins, or silicone. A glass sheet may be used in place of the coating film. In addition, a reinforcing member of a metal or the like may be provided on the back face.

EXAMPLES

Example 1

Figure 2:
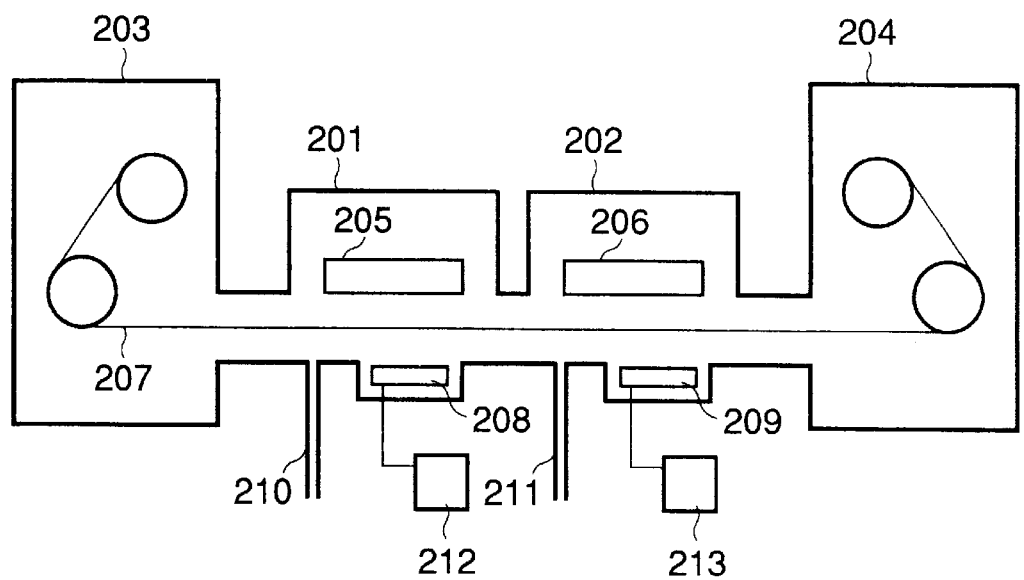
FIG. 2 is a view showing an example of a sputtering apparatus suitable for carrying out the present invention.

In the present example, the reflective layer 102 and the transparent, conductive layer 103 were made using the vacuum apparatus of the roll-to-roll type shown in FIG. 2.

A roll of stainless steel 0.13 mm thick, 120 mm wide, and 100 m long, the surface of which was processed by bright annealing and polished, was set in the feed chamber 203 and was made to extend up to the winding chamber 204. The whole apparatus was evacuated to a vacuum of not more than $10^{-4}$ Torr by the vacuum pump not illustrated, and thereafter conveyance of the stainless steel of the roll substrate 207 was started at a constant convey speed of 100 mm/min by a servo motor for winding while monitoring the speed by the encoder not illustrated.

Through the gas inlet pipe 210, argon was introduced at a flow rate of 50 sccm, hydrogen gas at 4 sccm, and oxygen gas at 2 sccm, the pressure inside the vacuum vessel 201 as a deposition chamber was kept at 3 mTorr, and, using the target 208 of aluminum of 250 mm×250 mm×6 mm thick and a purity of 99.99%, the reflective layer 102 was deposited in an average thickness of 100 nm, while supplying a power of 200 W from the DC power supply 212.

Subsequently, the substrate 207 was heated to a temperature of 200° C. by the heater 206, argon was introduced at 50 sccm through the gas inlet pipe 211, the pressure inside the vacuum vessel 202 as a deposition chamber was kept at 3 mTorr, and, using the target 209 of zinc oxide of 250 mm×250 mm×6 mm thick and a purity of 99.99%, the transparent, conductive layer 103 was deposited in an average thickness of 1000 nm, while supplying a power of 4000 W from the DC power supply 213.

This state was maintained for ten hours, whereby the reflective layer 102 and the transparent, conductive layer 103 were continuously produced throughout the length of 60 m on the substrate 207. The substrate thus produced was taken out and predetermined portions were cut out in the size of 5 cm×5 cm. The reflectivities of the thus obtained samples were measured by a spectrophotometer. All the reflectivities at portions of 5 m, 30 m, and 55 m from the start of production were 69% at the center of vibration due to interference of 800 nm.

Subsequently, using three substrates sampled at 5 m, 30 m, and 55 m from the start of production, on which the reflective layer and the transparent, conductive layer were formed, photovoltaic elements were produced in the manner as described above.

The characteristics of the photovoltaic elements were evaluated under irradiation with light of AM 1.5 (100 mW/cm$^2$). All three photovoltaic elements showed excellent conversion efficiencies, that is, photoelectric conversion efficiencies of 9.6±1%.

Further, the three samples were subjected to an environmental test for 500 hours in an environmental test box kept at a temperature of 95° C. and at a humidity of 95%. The conversion efficiency decreased only 0.1%, indicating no problem at all.

Example 2

By following the procedure of Example 1, except that water vapor was introduced at 3 sccm, together with argon gas at 50 sccm, through the gas supply pipe 210 into the vacuum vessel 201 instead of the supply of hydrogen gas and oxygen gas, the reflective layer and the transparent, conductive layer were produced.

The substrate thus produced was taken out and predetermined portions were cut out in the size of 5 cm×5 cm. The reflectivities of the samples were measured by a spectrophotometer. All the reflectivities at portions of 5 m, 30 m, and 55 m from the start of production were 68% at the center of vibration due to interference of 800 nm.

Using these three substrates, the subsequent layers including the semiconductor layer were made in the same manner as in Example 1, thereby forming photovoltaic elements. After completion of the photovoltaic elements, the characteristics of the photovoltaic elements were evaluated under irradiation with light of AM 1.5 (100 mW/cm$^2$). All three photovoltaic elements showed excellent conversion efficiencies, that is, photoelectric conversion efficiencies of 9.5+1%.

Further, the three samples were subjected to the environmental test for 500 hours in the environmental test box kept at the temperature of 95° C. and at the humidity of 95%. The conversion efficiency decreased only 0.1% indicating no problem at all.

Comparative Example 1-1

The reflective layer 102 and the transparent, conductive layer 103 were produced in the same manner as in Example 1, except that in formation of the reflective layer 102, evacuation was continued for over 2 hours down to a vacuum of not more than 5×10$^{31\ 6}$ Torr and sputtering was carried out in the presence of only argon gas.

The substrate thus produced was taken out and predetermined portions were cut out in the size of 5 cm×5 cm. The reflectivities of the samples were measured by a spectrophotometer. The reflectivities of the samples at 5 m, 30 m, and 55 m from the start of production were 67%, 64%, and 61%, respectively, at the center of vibration due to interference of 800 nm.

Using these three substrates, the subsequent layers including the semiconductor layer were made in the same manner as in Example 1, thereby forming photovoltaic elements. After completion of the photovoltaic elements, the characteristics of the photovoltaic elements were evaluated under irradiation with light of AM 1.5 (100 mW/cm$^2$). The photovoltaic elements showed photoelectric conversion efficiencies of 9.4%, 9.3% and 9.1%, respectively. The low reflectivities and the low conversion efficiencies are presumably due to the absorption of light by the grain boundaries of the aluminum film.

Comparative Example 1-2

The reflective layer 102 and the transparent, conductive layer 103 were produced in the same manner as in Example 1, except that argon was introduced at a flow rate of 50 sccm and oxygen gas at 2 sccm through the gas inlet pipe 210 without supplying hydrogen gas.

The substrate thus produced was taken out and predetermined portions were cut out in the size of 5 cm×5 cm. The reflectivities of the samples were measured by a spectrophotometer. The reflectivities of the samples at 5 m, 30 m, and 55 m from the start of production were each 69% at the center of vibration due to interference of 800 nm. Using these three substrates, the subsequent layers including the semiconductor layer were made in the same manner as in Example 1, thereby forming photovoltaic elements. After completion of the photovoltaic elements, the characteristics of the photovoltaic elements were evaluated under irradiation with light of AM 1.5 (100 mW/cm$^2$). The photovoltaic elements showed photoelectric conversion efficiencies of 7.2%, 6.9% and 6.5%, respectively.

The photovoltaic elements exhibited low conversion efficiencies, though the reflectivities thereof were as high as those in Example 1.

According to the research by the inventor, numerous defects were observed in the surface of the photovoltaic elements when a pulsed potential of −3.5 V and 1 sec was applied to the opposed electrodes in a saturated aluminum sulfate solution. The exact mechanism is not known, but it is believed that the reflective layer produced in the present comparative example includes such defects as to affect even the semiconductor layer. When the samples of Example 1 were checked by the pulsed potential applying test in the saturated aluminum sulfate solution in the same manner, no specific anomaly was observed.

The photovoltaic element obtained by the production method of the present invention has a reflective layer with high reflectivity, and it can effectively utilize the incident light. Therefore, absorption of light in the semiconductor layer increases, which achieves high conversion efficiency. It is thus expected that the photovoltaic elements can be utilized in smaller areas.

Further, the present invention permits continuous production for a long period without decrease of conversion efficiency, so that the present invention contributes to widespread use as a system power of inexpensive and highly reliable photovoltaic elements.

What is claimed is:

1. A method for producing a photovoltaic element having a reflective layer and a semiconductor layer on a substrate comprising the steps of:

supplying an inert gas, hydrogen atoms, and oxygen atoms into a vacuum vessel housing the substrate;

sputtering by use of a target comprising aluminum to form a reflective layer on the substrate; and forming a semiconductor layer over the reflective layer;

wherein the hydrogen atoms and the oxygen atoms are supplied by hydrogen gas and oxygen gas, respectively.

2. The method according to claim 1, wherein the flow rate ratio of the hydrogen gas to the inert gas is 2:100 to 10:100, and the flow rate ratio of the oxygen gas to the inert gas is 1:100 to 5:100.

3. A method for producing a photovoltaic element having a reflective layer and a semiconductor layer on a substrate comprising the steps of:

supplying an inert gas, hydrogen atoms, and oxygen atoms into a vacuum vessel housing the substrate;

sputtering by use of a target comprising aluminum to form a reflective layer on the substrate: and forming a semiconductor layer over the reflective layer;

wherein the hydrogen atoms and the oxygen atoms are supplied by water vapor and wherein the flow rate ratio of the water vapor to the inert gas is 2:100 to 10:100.

4. A method for producing a reflective layer for a photovoltaic element comprising the steps of:

supplying an inert gas, hydrogen atoms, and oxygen atoms into a vacuum vessel housing a substrate; and sputtering employing a target comprising aluminum to form a reflective layer on the substrate;

wherein the hydrogen atoms and the oxygen atoms are supplied by hydrogen gas and oxygen gas, respectively.

5. The method according to claim 4, wherein the flow rate ratio of the hydrogen gas to the inert gas is 2:100 to 10:100 and the flow rate ratio of the oxygen gas to the inert gas is 1:100 to 5:100.

6. A method for producing a reflective layer for a photovoltaic element comprising the steps of:

supplying an inert gas, hydrogen atoms, and oxygen atoms into a vacuum vessel housing a substrate; and sputtering employing a target comprising aluminum to form a reflective layer on the substrate;

wherein the hydrogen atoms and the oxygen atoms are supplied by water vapor and wherein the flow rate ratio of the water vapor to the inert gas is 2:100 to 10:100.

* * * * *

UNITED STATES PATENT AND TRADEMARK OFFICE
CERTIFICATE OF CORRECTION

PATENT NO. : 6,132,569
DATED : October 17, 2000
INVENTOR(S) : ATSUSHI SHIOZAKI

It is certified that error appears in the above-identified patent and that said Letters Patent is hereby corrected as shown below:

COLUMN 2

Line 57, "the findings," should read --these findings,--;

COLUMN 5

Line 56, "pc-Si layer 107" should read --$\mu$c-Si layer 107--;

COLUMN 8

Line 3, "9.5+1%." should read --9.5±1%.--;
Line 7, "0.1%" should read --0.1%,--;
Line 15, "5X10$^{31\ 6}$ Torr" should read --5X10$^{-6}$ Torr--.

Signed and Sealed this

Twenty-ninth Day of May, 2001

Attest:

NICHOLAS P. GODICI

*Attesting Officer*    Acting Director of the United States Patent and Trademark Office